(12) United States Patent
Brunton

(10) Patent No.: US 9,065,005 B2
(45) Date of Patent: Jun. 23, 2015

(54) METHOD AND APPARATUS FOR MAKING A SOLAR PANEL THAT IS PARTIALLY TRANSPARENT

(75) Inventor: Adam North Brunton, Headington (GB)

(73) Assignee: M-SOLV LTD., Oxford (GB)

( * ) Notice: Subject to any disclaimer, the term of this patent is extended or adjusted under 35 U.S.C. 154(b) by 492 days.

(21) Appl. No.: 13/389,833

(22) PCT Filed: Jul. 28, 2010

(86) PCT No.: PCT/GB2010/001432
§ 371 (c)(1),
(2), (4) Date: Mar. 15, 2012

(87) PCT Pub. No.: WO2011/018602
PCT Pub. Date: Feb. 17, 2011

(65) Prior Publication Data
US 2012/0164780 A1  Jun. 28, 2012

(30) Foreign Application Priority Data

Aug. 12, 2009  (GB) .................................. 0914063.3

(51) Int. Cl.
| | | |
|---|---|---|
| *H01L 31/18* | (2006.01) | |
| *H01L 27/142* | (2014.01) | |
| *H01L 31/0468* | (2014.01) | |
| *H01L 31/0236* | (2006.01) | |

(52) U.S. Cl.
CPC ........ *H01L 31/1804* (2013.01); *H01L 27/1427* (2013.01); *Y02E 10/547* (2013.01); *H01L 31/0468* (2014.12)

(58) Field of Classification Search
CPC .......................... H01L 31/1804; H01L 27/1427
USPC ............. 438/57, 71; 257/E31.13; 156/345.17
See application file for complete search history.

(56) References Cited

U.S. PATENT DOCUMENTS

| | | | |
|---|---|---|---|
| 5,254,179 A | 10/1993 | Ricaud et al. | |
| 5,388,919 A * | 2/1995 | Kimura et al. | 400/55 |
| 6,347,857 B1 * | 2/2002 | Purcell et al. | 347/19 |
| 6,423,567 B1 * | 7/2002 | Ludemann et al. | 438/83 |
| 6,858,461 B2 | 2/2005 | Oswald et al. | |

(Continued)

FOREIGN PATENT DOCUMENTS

| | | |
|---|---|---|
| DE | 10-2007-036296 | 9/2008 |
| WO | WO 2008/092186 | 8/2008 |

OTHER PUBLICATIONS

International Preliminary Report on Patentability for International Application No. PCT/GB2010/001432, Feb. 14, 2012.*

(Continued)

*Primary Examiner* — Mary Wilczewski
(74) *Attorney, Agent, or Firm* — Ked & Associates, LLP

(57) ABSTRACT

A method is described for making a partially transparent thin film solar panel based on transparent glass or plastic substrates by creating an array of small light transmitting apertures through all the opaque layers by using an ink jet print head to apply droplets of an etching fluid to the top electrode layer to form apertures in the electrode layer. These apertures may then be used as a contact mask for etching holes though the underlying active layer (if this is opaque). In this second stage, the etchant may be applied using an ink jet print head or by spraying or the panel may be immersed in the etchant.

10 Claims, 6 Drawing Sheets

(56) References Cited

U.S. PATENT DOCUMENTS

| | | | |
|---|---|---|---|
| 7,293,852 B2* | 11/2007 | Newsome et al. | 347/19 |
| 7,888,168 B2* | 2/2011 | Weidman et al. | 438/98 |
| 7,951,637 B2* | 5/2011 | Weidman et al. | 438/57 |
| 7,998,863 B2* | 8/2011 | Wenham et al. | 438/675 |
| 8,183,081 B2* | 5/2012 | Weidman et al. | 438/72 |
| 8,309,446 B2* | 11/2012 | Weidman et al. | 438/558 |
| 8,551,556 B2* | 10/2013 | Shrader et al. | 427/58 |
| 8,608,972 B2* | 12/2013 | Mayers et al. | 216/54 |
| 8,673,679 B2* | 3/2014 | Gallazzo et al. | 438/87 |
| 2003/0154908 A1* | 8/2003 | Webber et al. | 117/44 |
| 2004/0109038 A1* | 6/2004 | Newsome et al. | 347/19 |
| 2005/0247674 A1 | 11/2005 | Kubelbeck et al. | |
| 2007/0186971 A1 | 8/2007 | Lochun et al. | |
| 2009/0008787 A1* | 1/2009 | Wenham et al. | 257/773 |
| 2009/0130298 A1* | 5/2009 | Shrader et al. | 427/96.1 |
| 2010/0066779 A1* | 3/2010 | Gothait et al. | 347/14 |
| 2012/0164780 A1* | 6/2012 | Brunton | 438/71 |

OTHER PUBLICATIONS

International Search Report issued in PCT Application No. PCT/GB2010/001432 dated Jul. 1, 2011.

* cited by examiner

METHOD AND APPARATUS FOR MAKING A SOLAR PANEL THAT IS PARTIALLY TRANSPARENT

TECHNICAL FIELD

This invention relates to a new method for making thin film solar panels that are partially transparent.

BACKGROUND ART

There is a requirement to integrate solar panels into the structure of buildings. One concept for doing this involves installing the solar panels in place of windows. If conventional building windows are to be replaced with glass based solar panels or if flexible solar panels are to be applied to existing building window panes then it is essential that they have some partial degree of transparency and that they allow a continuous view to be obtained. A transparency in the range 5 to 20% is generally regarded as necessary. This is presently achieved in several ways.

In one case opaque square crystalline silicon or poly-silicon solar cells are used that are separated from each other in one or two directions in order to allow light to pass though the gaps. Since the cells generally have dimensions between 100 and 150 mm and electrical connections need to be made between cells this method leads to a complex window structure that does not permit a continuous view to be obtained.

In another case lasers have been used to cut apertures through silicon solar cells to create a degree of transparency. Sunways A G of Konstanz, Germany for example cut 64 square apertures each of about 5×5 mm in 125×125 mm solar cells giving an optical transparency of about 10%. Such a perforation method is slow and costly and in addition does not permit a continuous view.

In another case large opaque thin film solar panels are made to be partially optically transmitting by laser scribing through the opaque layers in a similar way to that used for creating the series interconnections between the multiple cells. In order to obtain the required optical transparency which is usually in the range 5 to 20% multiple parallel laser scribes are made along the panel in the direction perpendicular to the cell interconnection scribes. In order to carry out such a process in an economically viable time, i.e. comparable to the time taken to make the interconnect scribes, and to allow the required optical transmission it is necessary to make scribes that are much wider than the interconnect scribes. Such wide scribes are readily visible and do not allow a continuous view. U.S. Pat. No. 6,858,461 describes a process in which the scribe lines are in the direction perpendicular to the interconnect scribes. The lines may also be made on a graded pitch in order to vary the optical transparency in one dimension.

None of the processes described above readily allows partially transmitting solar panels to be made that allow a continuous view. For a continuous view it is necessary that the optically transmitting structures are indiscernible so that the whole panel appears to be partially transparent. One way of achieving this is to remove the opaque coating in the form of an array of small areas that are too small to be seen by eye at a reasonable distance from the panel. U.S. Pat. No. 4,795,500 describes the use of regular arrays of circular, triangular, square, hexagonal and polygonal shaped holes through the opaque layers on a solar panel. In that invention the holes are formed by selective chemical etching of the opaque layers following a photo-lithographic process involving application of a resist layer, which is exposed and developed to form a contact mask. This type of process is slow and costly and because a mask is required to define the hole pattern change of hole shape, pitch and uniformity is difficult.

Hence it is seen that in order to produce partially transparent solar panels that can be readily integrated into buildings in the form of windows, awnings and roof lights and fully satisfy aesthetic requirements in terms of appearance and allowing the presentation of 2D images a new type of high speed and low cost process is required. Such a process is revealed here.

US 2007/0007627 A1 discusses the use of an ink jet head to apply droplets of etchant fluid to a thin film crystalline silicon solar panel for the purpose of forming contacts to $n^+$ and $p^+$ regions on opposite sides of a silicon layer. Each droplet of the etchant fluid forms an aperture in an organic resist layer applied to the top of the panel active silicon layer. Subsequently these apertures are used as masks in further etching processes to create paths which extend partway through the silicon layer as far as the lower doped region. A metal layer is then applied into these paths to form electrical contacts with the lower doped region.

Reference herein to an ink-jet print head is to be understood to refer to a print head with one or more nozzles from which droplets of fluid can be ejected at predetermined times, e.g. under the control of a computer program. The type of print head used in an ink-jet printer is suitable for this. Such print heads are well known so will not be described further.

The present invention seeks to overcome limitations of the prior art and to provide solar panels which are partially transparent and have far greater opportunities for providing aesthetic designs and provides a new method and apparatus for forming such panels.

DISCLOSURE OF INVENTION

According to a first aspect of the invention, there is provided a method for forming a partially transparent thin film solar panel comprising a plurality of layers, one or more of which is opaque or semi-transparent, by providing an array of unconnected holes in one or more of the opaque or semi-transparent layers of the panel so as to provide an array of transparent or semi-transparent channels through the panel, the array of holes being formed using an ink-jet print head to deliver droplets of a first etchant fluid onto at least a first layer of the panel so the first etchant fluid etches a hole through the first layer, movement of the print head relative to the panel and/or the volume of the droplets being controlled so as to vary the spacing and/or the size of the holes, whereby the light transparency factor of the panel can be selectively controlled so that it can be varied in one or two dimensions.

According to a second aspect of the invention, there is provided apparatus for forming a partially transparent thin film solar panel comprising a plurality of layers, one or more of which is opaque or semi-transparent, by forming an array of unconnected holes in one or more of the opaque or semi-transparent layers of the panel so as to provide an array of transparent or semi-transparent channels though the panel, the apparatus comprising an ink-jet print head for ejecting droplets of a first etchant fluid, a stage system for scanning the print head relative to the panel and control means arranged to selectively control the rate of ejection of droplets from the print head, the scanning speed and/or the volume of each droplet whereby the light transparency factor of the panel is selectively controlled so as to be varied in one or two dimensions.

This invention involves a method of modifying an opaque thin film solar panel in order to create partially transparent areas, by forming a regular or irregular two dimensional array of unconnected holes in at least one opaque or semi-transparent layer thereof, using a print head, such as used in an inkjet printer, to deposit droplets of etchant in areas where light transmitting channels are to be formed through the panel.

The invention thus enables a solar panel based on thin film materials deposited on glass or polymer substrates to be provided with a degree of transparency that can be varied continuously in one or two dimensions across the panel surface. Uniform partial transmittance allows the solar panels to be incorporated into buildings in the form of windows or roof lights so fulfilling their primary role of allowing a controlled amount of light to enter the building but at the same time generating electricity and the varying partial transmittance permits the panel to display an image or part of an image.

The features that provide the partial transparency and the image are preferably sufficiently small so they are not discernable to the human eye, e.g. holes with a diameter in the range 0.1 mm to 0.15 mm. Holes of this size (and smaller) are sufficiently small so they are not readily discernable to the human eye. However, larger holes may be used.

Such panels can thus be readily integrated into buildings in the form of windows, awnings and roof lights and fully satisfy aesthetic requirements in terms of allowing the presentation of 2D half tone images.

An important preferred feature of the invention is that the pitch of the holes formed by the ink-jet print head can be changed while the print head is in motion over the panel whereby the optical transmission factor of the panel is varied so that images can be created.

The pitch of the holes in the panel in the direction perpendicular to the direction of motion of the print head can be varied to change the panel optical transparency in that direction and the pitch between holes in the direction parallel to the direction of motion of the print head can be adjusted during the process to provide gradual or sudden changes in optical transmission.

The pitch of the holes in the direction perpendicular to the direction of motion of the print head can be varied by tilting the print head about an axis perpendicular to the panel surface so that the effective pitch of the nozzles in the direction of motion reduces from the native, pitch of the print head. In addition the pitch can also be changed in this direction by using less than the full number of nozzles. The pitch of the holes in the direction parallel to the direction of motion of the print head is varied by controlling the firing rate of the nozzles. The hole pitch in both directions can thus be varied from the minimum value which just maintains the holes unconnected which, for a rectangular 2D array of holes, is a distance just greater than the hole diameter, up to a value that is many times the hole diameter.

As an example, for the case of a rectangular 2D array of round holes of 0.1 mm diameter on a pitch of 0.3 mm perpendicular to the direction of motion of the print head and a similar value in an orthogonal direction, the area transparency is 8.7%. If the pitch in both directions is reduced to 0.15 mm and 0.12 mm, the area transparencies increase to 35% and 54.5%, respectively. The optical transparency can increase to close to 78% for this 2D rectangular array before the holes start to touch and interconnect.

Because the instant at which the droplets are delivered as the ink jet head is moved over the panel surface is accurately controlled, it is possible to position the holes at any desired position along the motion direction. This means that as well as rectangular 2D arrays of holes it is possible to make any other regular array such as triangular, hexagonal, etc.

For the case of a triangular array of round holes, very high optical transparencies are possible. For 0.1 mm diameter holes in a triangular array with 0.15 mm and 0.12 mm between hole centres the optical transparencies are 40% and 63% respectively. The optical transparency can increase to close to 90% for a triangular array before the holes start to touch and interconnect.

As the timing and rate of release of droplets from the ink-jet print head can be changed while the head is in motion, it is also possible to make irregular or random 2D arrays where the holes have no fixed pitch. This feature permits much greater flexibility in terms of creating aesthetically pleasing images with half tone appearance on the solar panel.

Changing the 2D pitch of holes of identical size is just one way of changing the optical transparency of the solar panel. Another method can be used which involves changing the size of the holes. This can be achieved by varying the volume of etchant in the droplets (and/or delivering more than one droplet at a given point). A combination of hole size change and hole pitch change in one or both axes can be used to control panel transparency in a very flexible way.

As an example, consider a solar panel that has a size of 1.3×1.1 m in the opaque coatings of which it is required to make a rectangular array of round holes of 0.15 mm diameter on a pitch of 0.3 mm over the whole area of the opaque coatings in order to achieve an optical transparency of about 20%. A single Dimatix Spectra G3 (Trade Mark) print head is moved over the panel surface by means of a two axis motion system. The head is moved in a series of passes parallel to the long edge of the panel and after each pass it is moved sideways, parallel to the short edge of the panel, to gain access to a fresh area of panel. The head is rotated about an axis perpendicular to the panel surface such that the line of nozzles on the print head is at an angle of 53.8° to the short edge of the panel to reduce the native nozzle pitch of 0.508 mm to an effective 0.3 mm in the direction perpendicular to the motion direction. In this case the width of the swathe covered on each pass by the 128 nozzles on the print head is 38.4 mm. This means that 29 passes of the print head along the length of the panel are needed to fully cover the 1.1 m width. If the full process needs to be completed in a reasonable time such as 50 sec, then the time allowed for each pass along the panel length is only 1.7 sec which means that a print head to panel relative speed of close to 1 m/sec is required. Such a print head speed is not a problem in terms of nozzle firing rate since for a droplet pitch of 0.3 mm along the head travel direction a speed of 1 m/sec requires the nozzles to fire at 3.33 kHz. This is well within the capability of the print head.

However, high print head travel speeds are generally regarded as undesirable from the motion system point of view as very high rates of acceleration and deceleration are then required at the end of each pass to ensure turnaround times and stage over-travel are minimized. Hence, it is likely that more than one ink jet head will be used in order to reduce the print head speeds to acceptable levels. In the example above, use of two parallel print heads reduces the maximum speed requirement to less than 0.5 m/s which reduces the loading on the motion system significantly. When more than one print head is used, it is preferred that the print heads are mounted separately on the same structure with a fixed separation so they move in unison and so that each one independently processes an area of the panel. For the case of two print heads each covers half of the panel area and the print heads have a separation of half the panel width (550 mm in this case). Alternatively, print heads can be mounted immediately adjacent to each other to print a wider swathe.

As another example, consider the case where a panel with dimensions 600×1200 mm is required to be perforated uniformly with holes of 0.1 mm diameter on a pitch of 0.3 mm in both directions to achieve an optical transparency of about 8.7%. In this case, the panel is processed with a single Trident 256 (Trade Mark) print head having 256 nozzles with a native pitch of 0.397 mm. The print head is moved parallel to the long edge of the panel and is rotated about an axis perpendicular to the panel surface such that the line of nozzles on the print head is at an angle of 40.9° to the short edge of the panel to reduce the effective pitch of the nozzles in the direction perpendicular to the travel direction to 0.3 mm to match the required hole pitch in that direction. In this case, the width of the swathe covered on each pass is 76.8 mm. After each pass along the panel length the print head is moved sideways by one swathe width to access a fresh area of the panel. Eight passes are required to cover the full panel width of 600 mm. If the head moves at a speed of 0.4 m/s, each pass along the panel length takes 3 sec and assuming a turnaround time at the end of each pass of 0.5 sec then the time to cover the whole panel is 28 seconds. In this case, the nozzles are firing at a rate of 1.33 kHz to achieve the required hole pitch of 0.3 mm As an example of how this ink jet based perforation technique can be scaled up to process larger panels consider the case of a 2.2×2.4 m solar panel where a uniform regular array of 0.1 mm diameter holes aligned to the edges of the panel having a 2D pitch of 0.25 mm is required in order to give an optical transparency of about 12.5%. In this case, four KM1024 (Trade Mark) print heads each having two rows of nozzles containing 512 nozzles on a pitch of 0.141 mm are used. Only one row of nozzles is used on each head and, since the native nozzle pitch along the row is less than the required hole pitch in the direction perpendicular to the motion direction, alternate nozzles along the row only are used. The native pitch along the print head thus becomes 0.282 mm and so the print head is rotated about an axis perpendicular to the panel surface such that the line of nozzles on the print head is at an angle of 27.6° to the edge of the panel that is perpendicular to the print head travel direction. This reduces the effective pitch to the 0.25 mm required. At this tilt the width of the swathe processed by each print head on each pass is 64 mm. The four print heads are mounted in a line parallel to the short edge of the panel and perpendicular to the travel direction with the print head spacing set at 550 mm which is one quarter of the panel width so that each print head covers one quarter of the panel surface. Nine passes of the row of four heads along the panel length are required for complete coverage of the full panel area. For a head speed along the panel length of 0.5 m/s each pass over the full panel length of 2.4 m takes 4.8 sec and with a turnaround time of 0.5 sec per pass added the total panel process time becomes 48 seconds.

In the above examples, the use of one, two or four print heads have only been taken to illustrate the process. Any number of print heads is possible depending on the panel size and process time requirements.

An important feature of this invention is that images can be created on the solar panel by changing the optical transmission in 2 dimensions. In the case where multiple print heads are used then each unit has a separate control system so that the pitch of holes in the motion direction is independently adjustable. In addition, if the print heads have so called "greyscale" capability the droplet volume dispensed by each of the multiple nozzles on the print heads is independently adjustable to allow independent hole size changes. Each print head then creates its own part of the final full panel image.

For a solar panel to operate most efficiently it is important that all of the separate cells that are series interconnected are balanced with respect to each other having similar resistance and electrical performance. This means that when making panels that are partially transparent by removing areas of the opaque coatings it is important to ensure that the total areas removed from each cell within a single panel are similar. When partial transparency is provided in the manner described above where the size and pitch of these holes is varied from one cell area to another cell area in order to create 2D halftone images care has to be taken to ensure that the cells are electrically balanced. This can be achieved by controlling the operation of the print heads and stages (e.g. by suitable software) such that the size, pitch and placement of individual droplets within each cell are adjusted so that the array of holes formed creates a 2D half-tone image that covers multiple cells whilst at the same time maintaining the total area of the holes created within each cell at substantially the same level. By this means, the resistance of the cells remains balanced and electrical performance of the overall solar panel is not compromised. The ability to vary the sizes and spacing of the holes formed thus not only enables half tone images to be formed but also enables these to be formed in a manner that allows the total area of the holes within each cell to be carefully controlled.

When a half tone image extends across a plurality of the cells it is also possible to compensate for the differences between cells by providing additional transparency, e.g. in areas away from the image, in cells on which darker and/or fewer parts of the image lie so that the electrical performance of each cell is substantially similar.

Whilst, it is preferred that the electrical performance of each cell is substantially similar, in some cases it is sufficient to ensure that the variation in the electrical performance of each cell is within a predetermined range (e.g. with a maximum of 10% variation between cells).

In some cases, it may be necessary, or desirable, to etch a hole through one or more further layers of the solar panel in order to form a transparent or semi-transparent channel though the panel. In this case, one or more further etchant fluids may be used. The holes formed in the manner described above can be used as a contact mask for the application of a secondary etchant to the underlying layer. This secondary etchant may be applied by immersing the panel (or part of it) in the secondary etchant, by applying the secondary etchant into the holes formed by the primary etchant by means of an ink-jet print head (in a similar manner to that described for the primary etchant) or it may be applied in the form of a spray so it flows into the holes formed by the primary etchant. Further etchants may also be applied (if necessary or desirable) to one or more further underlying layers in a similar manner through the holes formed in the upper layers.

Other preferred features of the invention will be apparent from the following description and from the subsidiary claims of the specification.

BRIEF DESCRIPTION OF DRAWINGS

The invention will now be further described, merely by way of example, with reference to the accompanying drawings, in which:

FIG. 1 shows the structure of a typical thin film solar panel comprising a substrate 1, upper and lower electrodes 2, 3 and an active layer 4 sandwiched between the upper and lower electrodes 2, 3. At least one of the layers 2, 3 and 4 is opaque. For so called "superstrate" type solar panels where the sun light passes through the substrate 1 to reach the active layer 4, the substrate 1 is transparent, e.g. of glass or plastic, the lower electrode 3 is also transparent, the upper electrode 2 is opaque and the active layer 4 is opaque (or in some cases semi-transparent). In the case of so called "substrate" type solar panels where the sun light enters the stack of layers directly, the lower electrode 3 is opaque, the upper electrode 2 is transparent and the active layer 4 is opaque (or in some cases semi-transparent).

The majority of thin film solar panels produced are of the "superstrate" type so the invention will be further described in terms of the structure of this type of panel. However, with the use of suitable etchant materials, the techniques described in the present invention can also be applied to panels of the "substrate" type.

Figure 1:
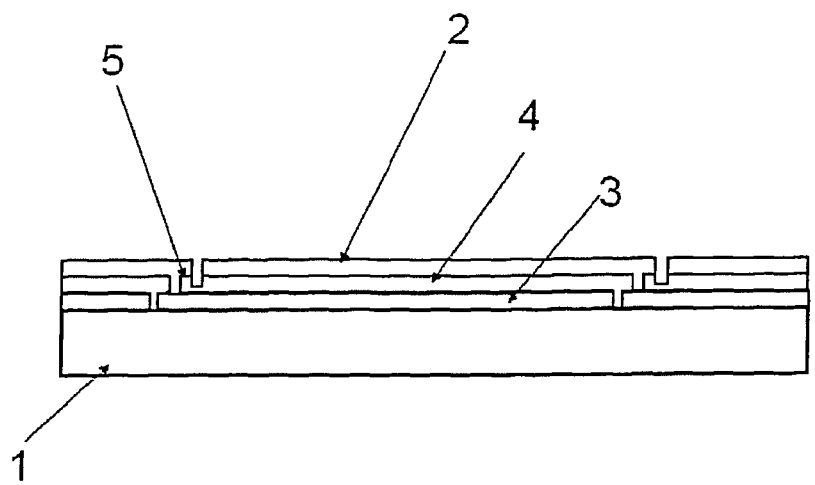
FIG. 1 is a schematic diagram showing the structure of a typical thin film solar panel.

FIG. 1 also shows interconnecting structures 5 which provide an electrical connection between the upper and lower electrodes 2, 3 and electrical isolation between parts of the upper electrode 2 either side of the interconnection structure 5 and electrical isolation between parts of the lower electrode 3 either side of the interconnection structure 5. Such interconnection structures are well known so will not be described further.

Figure 2:
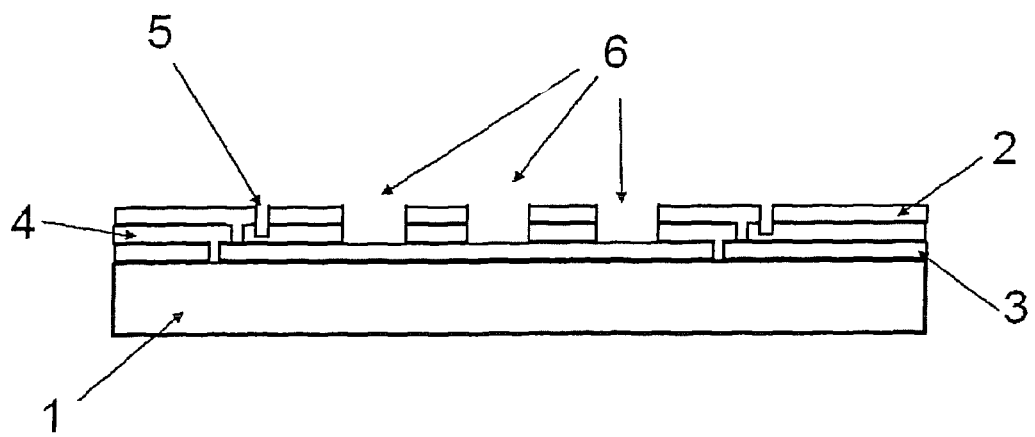
FIGS. 2 to 8 are schematic diagrams illustrating etching of layers of such a thin film solar panel according to preferred embodiments of the invention.

One embodiment of the invention relates to a method of forming small holes 6 through the opaque upper electrode 2 and the opaque or semi-transparent active layer 4, as shown in FIG. 2, to permit light transmission through these holes and hence forming a transparent (or semi-transparent) channel through the solar panel.

FIGS. 3 to 8 illustrate a method of etching these holes 6 though the layers 2 and 4.

Figure 3:
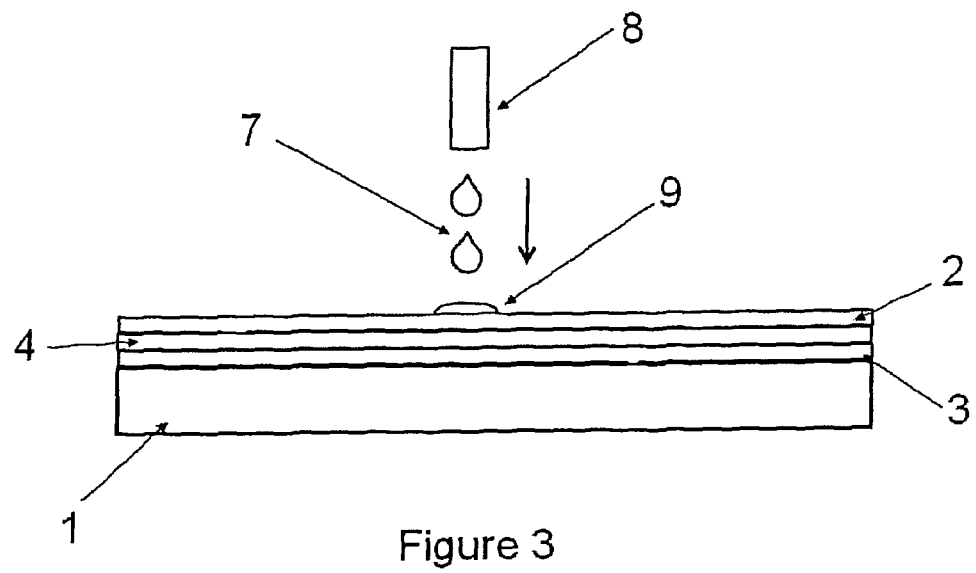
Figure 4:
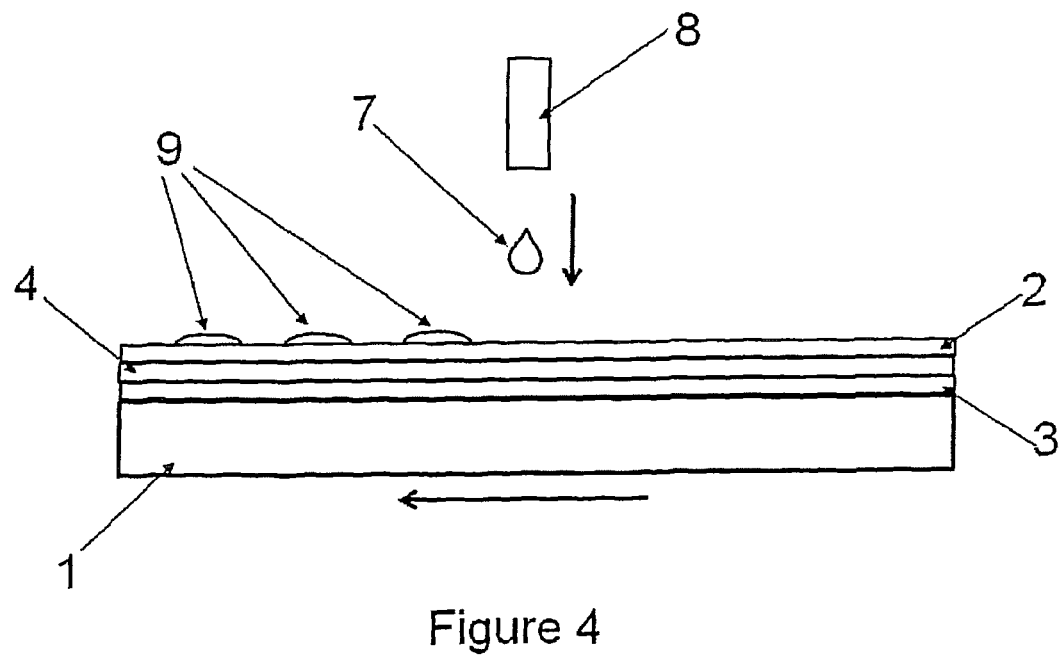

FIG. 3 shows droplets 7 of a primary etchant solution emitted from a nozzle 8 on an ink jet head positioned over the panel to form a droplet 9 of etchant on the layer 2. Examples of primary etchant fluids for various upper electrode layers are:—
  1) A mixture of Phosphoric acid (H3PO4), acetic acid (CH3COOH) and water for doped Zinc oxide (ZnO:Al) and metals such as aluminium and silver
  2) A mixture of Hydroflouric acid (HF), Hydrogen peroxide (H2O2) and water for Indium Tin oxide (ITO)
  3) A mixture of hydrochloric acid (HCl) and water for doped Zinc oxide (ZnO:Al) and Tin oxide (SnO2)
  4) Sodium hydroxide (NaOH) solution in water for aluminium
  5) A mixture of Nitric acid (HNO3), Hydrochloric acid (HCl) and water for silver and doped Zinc oxide (ZnO:Al)
  6) A mixture of Sulphuric acid (H2SO4), Nitric acid (HNO3) and water for molybdenum
  7) A mixture of Hydrochloric acid (HCl), Hydrogen peroxide (H2O2) and water for molybdenum FIG. 4 illustrates formation of a series of discrete droplets 9 of etchant on the upper layer 2 by movement of the print head 8 relative to the panel.

Figure 5:
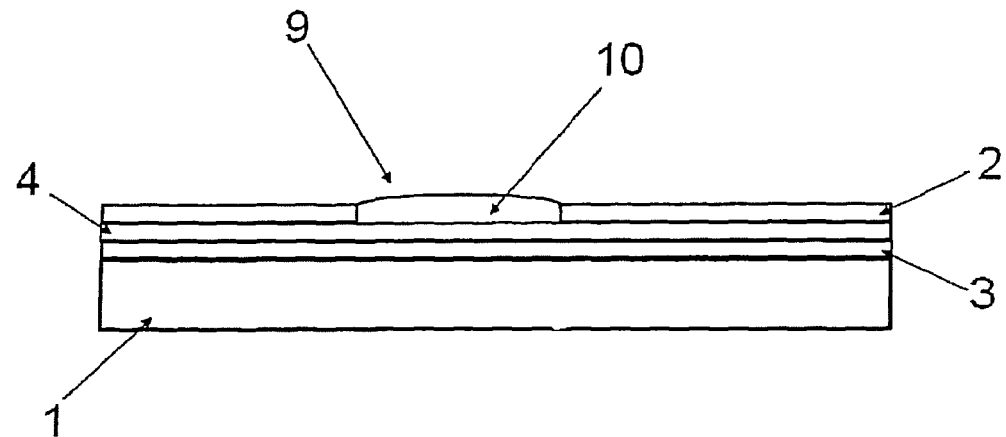
Figure 6:
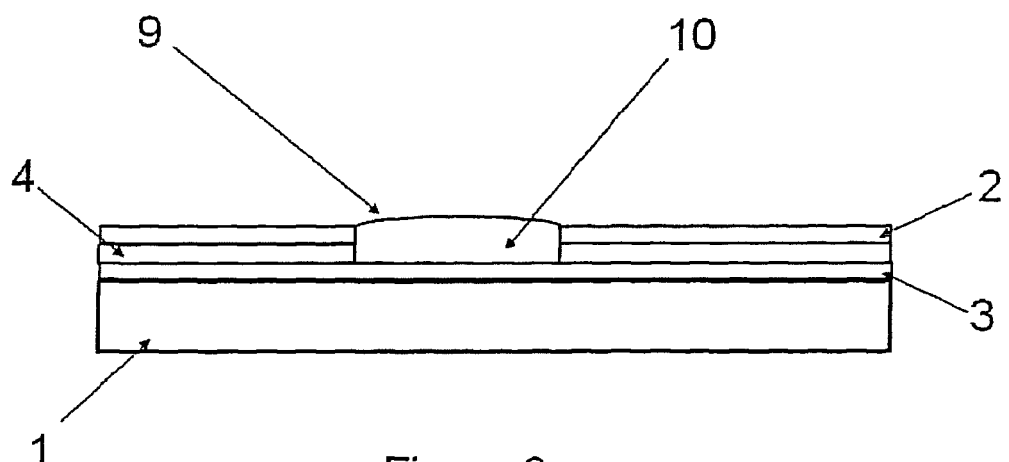

The etchant is selected to dissolve the upper layer 2 to form a hole 10 therethrough in the area covered by the droplet as illustrated in FIG. 5 and to dissolve the layer 4 so the hole 10 is etched through this layer too, as illustrated by FIG. 6.

Figure 7:
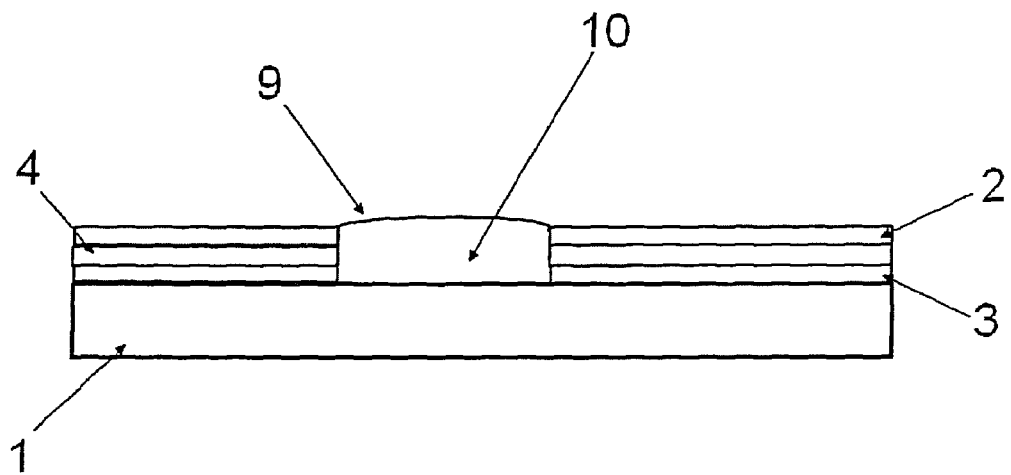

If the lower electrode layer 3 is opaque, as is likely to be the case with a solar panel of the "substrate" type, the etchant is selected to etch through this as well so the hole thus formed passes though the layers 2, 3 and 4 as shown in FIG. 7. If the lower electrode layer 3 is transparent, the hole need not be etched through this layer in which case the etchant is selected to etch the material from which layers 2 and 4 are formed but not layer 3.

If the active layer is semi-transparent then it may be sufficient to form holes through the upper electrode layer only in order to achieve adequate transmission through the panel.

Figure 8:
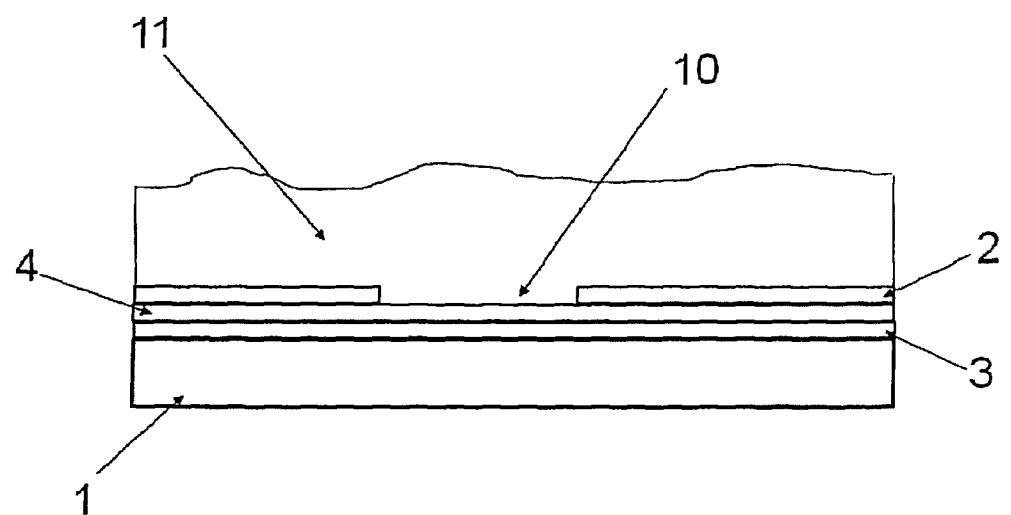

Another alternative is illustrated in FIG. 8. In this case, the primary etchant used etches through the upper electrode layer 2 but not through the active layer 4. Instead, the hole 10 formed in the upper electrode layer 2 is used as a contact mask for a secondary etchant 11 which is applied to the entire upper layer 2, e.g. by being immersed therein. The secondary etchant 11 is selected to etch through the active layer 4 and though the lower electrode layer 2 (if it is opaque) but not attack the material comprising the upper electrode layer 2. Examples of secondary etchant fluids for various active material layers are:—
  1) Sodium hydroxide (NaOH) or Potassium hydroxide (KOH) solution in water for amorphous, micro-crystalline or poly-crystalline silicon
  2) A mixture of Hydrofluoric acid (HF), Nitric acid (HNO3) and water for amorphous, micro-crystalline or poly-crystalline silicon
  3) A mixture of Nitric acid (HNO3), Phosphoric acid (HCl) and water for Cadmium Telluride (CdTe) or Copper Indium Gallium di-selenide (CIGS)
  4) A mixture of Sulphuric acid (H2SO4), Hydrogen peroxide (H2O2) and water for Cadmium Telluride (CdTe) or Copper Indium Gallium di-selenide (CIGS)
  5) A mixture of Sulphuric acid (H2SO4), Potassium dichromate (K2Cr2O7) and water for Cadmium Telluride (CdTe) or Copper Indium Gallium di-selenide (CIGS)

In another case, where the lower electrode layer is opaque and hence requires etching, the primary etchant delivered by the ink jet print head etches through the upper electrode layer 2 and through the active layer 4. The hole 10 formed in the upper electrode layer and active layer is used as a contact mask for a secondary etchant 11 which is applied to the entire upper layer 2, e.g. by being immersed therein. The secondary etchant 11 is selected to etch through the opaque lower layer 3 but not attack the material comprising the upper electrode layer 2 or the active layer 4.

In yet another case, where the lower electrode layer is opaque and hence requires etching, the primary etchant delivered by the ink jet print head etches through the upper layer 2 but not through the active layer 4. Instead, the hole 10 formed in the upper layer 2 is used as a contact mask for a secondary etchant 11 which is applied to the entire upper layer 2, e.g. by being immersed therein. The secondary etchant 11 is selected to etch through the active layer 4 but not attack the material comprising the upper electrode layer 2. The hole thus created in the upper and active layers is then used as a contact mask for a tertiary etchant which is applied to the entire upper electrode layer 2, e.g. by being immersed therein. The tertiary etchant is selected to etch through the opaque lower electrode layer 3 but not attack the material comprising the upper electrode layer 2 or the active layer 4. Examples of tertiary etchant fluids for various lower electrode layers are:—
  1) A mixture of Phosphoric acid (H3PO4), acetic acid (CH3COOH) and water for metals such as aluminium and silver
  2) Sodium hydroxide (NaOH) solution in water for aluminium
  3) A mixture of Sulphuric acid (H2SO4), Nitric acid (HNO3) and water for molybdenum 4) A mixture of Hydrochloric acid (HCl), Hydrogen peroxide (H2O2) and water for molybdenum In the above cases, the secondary and/or the tertiary etchant may also be applied by an ink-jet print head rather than by immersion in the etchant. In such a case, the secondary (and/or tertiary etchant) may be applied as droplets from an ink-jet print head into the holes formed by the primary etchant. This may be done by means of the same print head (e.g. if each print head may be provided with two or three different etchant fluids) or by means of a separate print-head mounted on the same structure as the primary print head.

The secondary (and/or tertiary) etchant would be applied in separate passes of the print heads) over the solar panel once the primary etchant had formed a hole in the upper layer (and the panel had been rinsed). The control system that controls the motion of the print heads over the panel surface ensures accurate registration of the droplets of secondary (and/or tertiary) etchant with respect to the holes created by the primary etchant. The panel may require rinsing after each etching stage in order to remove excess etchant and dissolved material and this is likely to be carried out in a location away from the apparatus which applies the etchants by means of the print heads. In view of this, the secondary and tertiary etchant fluids may be applied by print heads mounted on separate apparatus. In this case, these secondary (and/or tertiary) etchant ink jet machines are equipped with suitable control systems to locate the position of the existing holes in the panel and the stage control system is capable of adjusting the motion of the print heads over the panel surface so that the droplets of secondary (and/or tertiary) etchant are accurately registered with respect to the existing holes.

The secondary and/or tertiary etchants could also be applied by spraying the etchant fluid over the solar panel so that it flows into the holes formed by the primary etchant. As for the case where the panel is totally (or partially) immersed in the secondary and/or tertiary etchants, this avoids the need to accurately align the application of the secondary and/or tertiary etchants with the holes formed by the primary etchant.

Apparatus for forming a partially transparent thin film solar panel by forming small transparent apertures in opaque or semi-transparent layers of the panel in the manner described above may comprise:
  a. a print head able to deliver on demand a plurality of droplets of a first etchant fluid to chemically etch the upper inorganic electrode layer
  b. a mounting system that holds the print head with respect to the panel such that the droplets of the first etchant fluid ejected by the print head land on the surface of the panel
  c. a linear stage system for causing relative motion between the print head and the panel surface, the motion preferably being in two orthogonal axes both of which are parallel to the panel surface
  d. a first control system for moving the print head relative to the panel and driving the electronic control of the print head such that individual droplets of the first etchant fluid are applied to the panel surface in required locations, and
  e. a second control system for controlling the ejection rate and/or volume of the droplets.

The apparatus is operated so that a plurality of droplets of the first etchant solution are applied at required positions over all or part of the panel surface followed by a first etching process whereby the droplets of the first etchant fluid residing on the panel surface interact with the material of the top electrode layer to form holes in the top electrode layer corresponding to the position of the droplet to locally expose the underlying semiconductor layer. The droplets of the first etchant fluid may then be used to etch holes in the underlying semiconductor layer and, if the lower electrode layer is opaque metal, the droplets of the first etchant fluid may be used to etch holes through this as well so the hole is etched through each of the opaque layers whereby a light transmitting channel is formed through the panel.

Alternatively, after the first etchant fluid has etched holes through the top electrode layer, a second etching process may be applied in which the top electrode layer (and the holes formed therein) is used as a contact mask for a second etchant fluid which is applied to etch holes through the underlying semiconductor layer (and though the lower electrode layer if this is also opaque). As discussed above, the secondary etchant may be applied by means of a print head, by spraying or by immersion.

Alternatively, after the first etchant fluid has etched holes through the top electrode layer, and the second etchant fluid has etched holes through the underlying semiconductor layer, a third etching process may be applied in which the top electrode layer and the active layer (and the holes formed therein) are used as a contact mask for a third etchant fluid which is applied to etch holes through the opaque lower electrode layer. Again, the tertiary etchant may be applied by means of a print head, by spraying or by immersion as discussed above.

Other arrangements are possible, e.g. the first etchant may etch through the upper electrode and the semiconductor layer and the second etchant though the lower electrode (if this is opaque).

Figure 9:
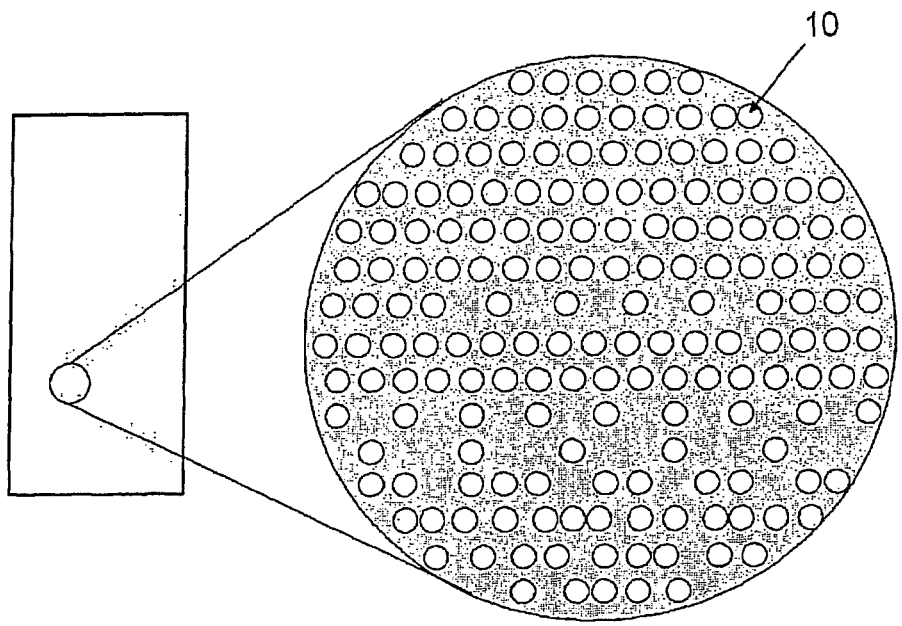
FIGS. 9 and 10 show enlarged plan views of hole patterns that can be formed in this manner in a solar panel.
Figure 10:
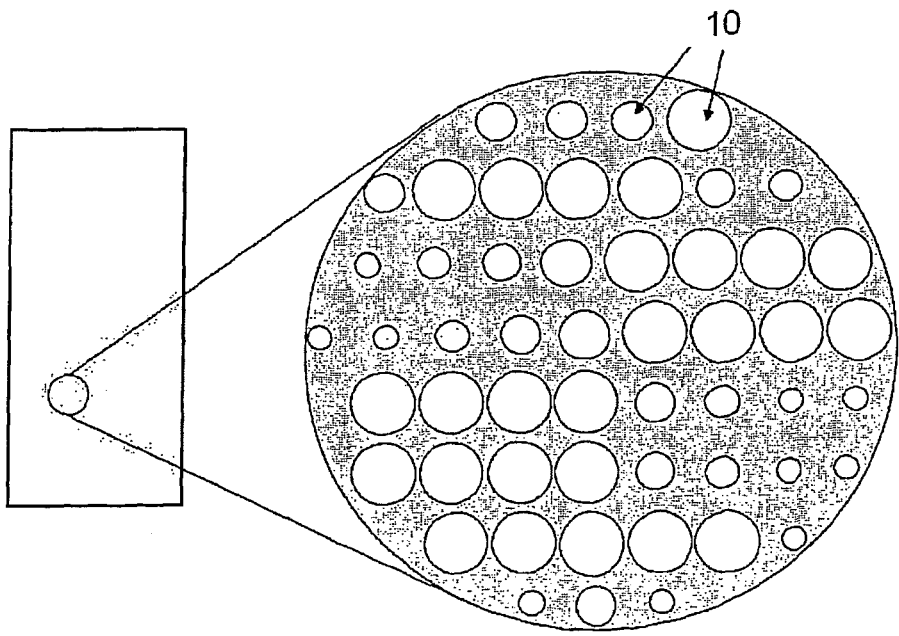

FIGS. 9 and 10 respectively show enlarged plan views showing how the ink jet droplet position and size can be varied to create half-tone images.

Figure 11:
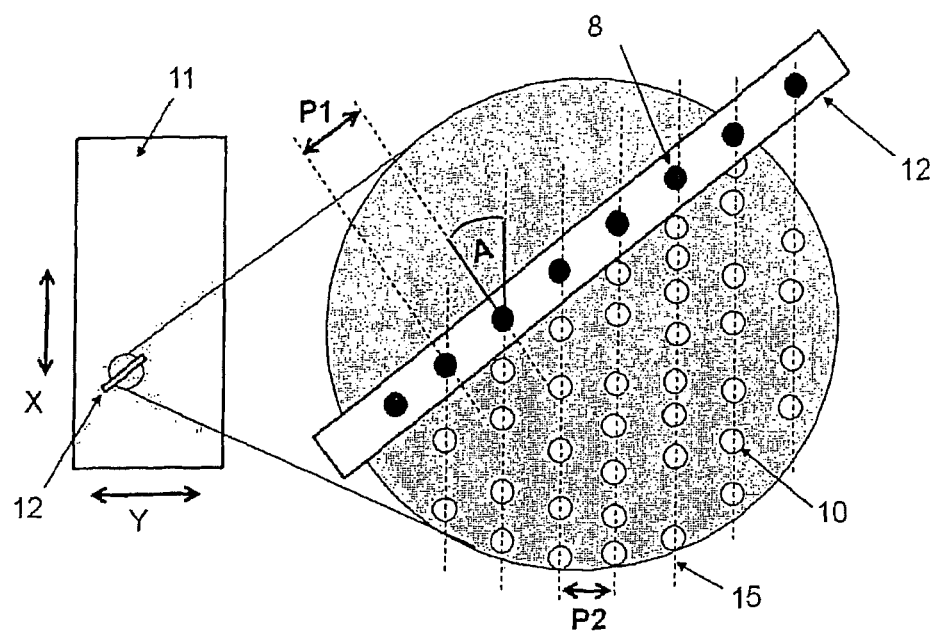
FIG. 11 shows a schematic plan view of an ink jet print head positioned over a thin film solar panel to deliver droplets of etchant onto the panel.

FIG. 11 shows a schematic plan view of the nozzle plate of an ink-jet print head 12 used in apparatus of the type described above. FIG. 11 shows the print head 12 positioned over a solar panel 11 and shows how the print head 12 is angled with respect to the direction of travel (X) of the head 12 relative to the panel 11 so as to reduce the effective printing pitch of the nozzles 8 so that droplets of etchant are placed at the correct locations in the direction (Y) perpendicular to the travel direction.

The solar panel 11 is mounted on a linear stage so that it can be moved backwards and forwards along an axis X and the ink-jet print head 12 is mounted over the panel 11 on a stage system that allows it to be moved backwards and forwards along an axis Y. In this way, the whole surface of the panel 11 can be covered by the print head 12. The right hand side of the figure shows an enlarged view of part of the print head 12 and the panel 11 below it.

The print head 12 has a row of nozzles 8 on a pitch P1 along the length of the print head 12. The print head 12 is rotated about an axis perpendicular to the panel surface 11 such that the normal to the line of nozzles is at an angle A to the direction (X) of travel of the panel 11. In this case, the nozzles 8 eject droplets of etchant onto the panel surface 11 to make holes 10 in the layers in rows 15 that are parallel to the panel travel direction X and have a pitch P2 in the Y direction that is less that the nozzle pitch P1, the pitch P2 being given by:—

$$P2 = P1 \times Cosine A$$

FIG. 11 also illustrates how, with a print head angled to the direction of travel X, the pitch of the rows of holes created in the Y direction is determined by the geometry of the print head 12 (and hence is fixed) whereas the holes produced by droplets from each nozzle can be formed at irregular intervals (as shown) along the rows 15 (in the direction X) as each nozzle 8 can be caused to eject a droplet of etchant at any instant.

The apparatus described thus provides a method for modifying an opaque thin film solar panel in order to create partially transparent areas by means of forming arrays of small transparent (or semi-transparent) channels through the opaque films using individual droplets of suitable etchant fluid delivered to the panel by means of a multi nozzle, drop on demand, ink jet print head. The etchant fluid may be used to etch a hole which provides light transmission through an opaque (or semi-transparent layer) and/or may be used to form a contact mask for the etching of a hole through one or more underlying layers (which may be opaque or semi-transparent).

Preferably, each individual droplet of etchant fluid etches an individual aperture through the top conducting inorganic or metal electrode layer (whether this top layer is transparent, semi-transparent or opaque). These apertures then act as masks for subsequent etching processes whereby the underlying active layer and the lower electrode layer (if either of these is opaque) are etched to form light transmissive channels through the panel. Alternatively, a single etchant fluid may be used to etch the top electrode layer and the lower layer(s).

Many different ways of effecting the required relative motion between the solar panel and the print heads are possible. The panel can remain stationary during processing with the heads moving in one or two axes by means of a moving gantry over the panel. Alternatively, the print heads can be held stationary and the panel caused to move in one or two axes. It is also possible for the panel to be moved in one axis and the print heads moved in the orthogonal axis, if required.

The method described herein forms transparent openings through the opaque layers of a thin film solar panel where the panels are generally divided up into multiple series connected individual cells and the electrical contacts are made at the panel edges.

The invention claimed is:

1. A method for forming a partially transparent thin film solar panel comprising a plurality of layers, one or more of which is opaque or semi-transparent, by providing an array of unconnected round holes in one or more of the opaque or semi-transparent layers of the panel so as to provide an array of transparent or semi-transparent channels through the panel, the method comprising:
   using an ink-jet print head to deliver individual droplets of a first etchant fluid onto at least a first layer of the panel, to form the array of unconnected round holes in at least the first layer of the panel; and
   at least one of controlling a size of the individual droplets and a position at which the individual droplets are delivered to determine a size and position of individual holes of the array of unconnected round holes formed through the first layer, each hole being formed by delivery of one or more droplets at a given point, a spacing of the individual holes being varied by controlling movement of the ink-jet print head relative to the panel and a timing of droplet release, thereby controlling the positions at which the individual droplets are delivered, or varying the size of the individual holes by controlling a volume of the individual droplets ejected by the ink-jet print head as the ink-jet print head is moved relative to the panel, whereby a light transparency factor of the panel is selectively controlled so that the light transparency factor is varied in one or two dimensions.

2. The method as claimed in claim 1, wherein the first layer is opaque or semi-transparent.

3. The method as claimed in claim 1, wherein the first etchant fluid is selected so as to etch through at least the first layer but not through a second layer, which is opaque or semi-transparent, and wherein a second etchant fluid is applied to the panel to etch holes in the second layer through the holes formed in the first layer.

4. The method as claimed in claim 3, wherein the second etchant fluid is applied to the panel by immersion of at least the first and second layers in the second etchant fluid, or applied as droplets from the ink-jet print head or by means of a spray.

5. The method as claimed in claim 1, wherein each hole is formed by a single droplet of the first etchant fluid.

6. The method as claimed in claim 1, wherein the ink-jet print head is scanned relative to the panel and the spacing of the holes formed is varied by changing a droplet ejection rate and/or a scanning speed.

7. The method as claimed in claim 1, wherein the light transparency factor is varied in two dimensions so as to form a half tone image on the panel.

8. The method as claimed in claim 1, wherein the panel comprises a plurality of interconnected solar cells, and wherein variations in light transparency factor across each cell are arranged such that an electrical performance of each cell is within a predetermined range compared to the other cells.

9. The method as claimed in claim 7, wherein a half tone image extends across a plurality of cells and additional transparency is provided in cells on which darker and/or fewer portions of the image lie so that an electrical performance of each cell is within a predetermined range.

10. The method as claimed claim 1, wherein the droplet size is selected such that the holes formed are sufficiently small so that they are not readily discernable to the human eye.

* * * * *